United States Patent
Tani et al.

(10) Patent No.: US 6,846,549 B2
(45) Date of Patent: Jan. 25, 2005

(54) MULTILAYER PRINTED WIRING BOARD

(75) Inventors: Motoaki Tani, Kawasaki (JP);
Nobuyuki Hayashi, Kawasaki (JP);
Hiroyuki Machida, Kawasaki (JP);
Takeshi Ishitsuka, Kawasaki (JP);
Yasuo Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 506 days.

(21) Appl. No.: 09/962,126

(22) Filed: Sep. 26, 2001

(65) Prior Publication Data

US 2002/0182958 A1 Dec. 5, 2002

(30) Foreign Application Priority Data

Apr. 23, 2001 (JP) ........................................ 2001-124723

(51) Int. Cl.$^7$ .............................. B32B 3/00; H05K 1/00
(52) U.S. Cl. .................... 428/209; 174/258; 442/60; 442/65; 442/70; 442/172; 442/175; 442/180
(58) Field of Search ............................ 428/209; 442/59, 442/60, 65, 70, 172, 175, 180

(56) References Cited

U.S. PATENT DOCUMENTS 5,236,777 A * 8/1993 Inoguchi et al. .............. 442/60
5,807,793 A * 9/1998 Scari et al. .................... 442/60
5,837,624 A * 11/1998 Sakaguchi et al. .......... 442/208
6,417,459 B1 * 7/2002 Kanzaki et al. ............. 174/254
6,530,147 B1 * 3/2003 Haas et al. .................... 29/829

FOREIGN PATENT DOCUMENTS

| JP | 4-309284 | 10/1992 |
| JP | 5-129779 | 5/1993 |
| JP | 5-140873 | 6/1993 |
| JP | 6-97670 | 4/1994 |
| JP | 7-297511 | 11/1995 |
| JP | 7-314607 | 12/1995 |
| JP | 10-303556 | 11/1998 |
| JP | 11-158752 | 6/1999 |
| JP | 11-233941 | 8/1999 |
| JP | 11-273456 | 10/1999 |
| JP | 2000-234239 | 8/2000 |
| JP | 2001-7453 | 1/2001 |

* cited by examiner

Primary Examiner—Cathy Lam
(74) Attorney, Agent, or Firm—Armstrong, Kratz, Quintos, Hanson & Brooks, LLP

(57) ABSTRACT

A multilayer printed wiring board includes a core member having a plurality of glass clothes impregnated with a resin. Each of the glass clothes is woven with glass yarns each of which includes a bundle of glass filaments. One or more buildup layers are laminated on one or each surface of the core member. The core member has an elastic modulus which is no less than 100 times that of the buildup layer at 240° C.

15 Claims, 5 Drawing Sheets

MULTILAYER PRINTED WIRING BOARD

BACKGROUND OF THE INVENTION

1. Field of the Invention

The present invention relates to a multilayer printed wiring board for use in electric or electronic components. More particularly, the present invention relates to a multilayer printed wiring board comprising a core member and buildup layers laminated on the core member.

2. Description of the Related Art

Due to the need for increasing the wiring density of an electric/electronic circuit for use in electric/electronic devices, a multilayer printed wiring board including a plurality of conductive layers for mounting electronic components is widely used. Such multilayer printed wiring boards are generally divided into two groups in accordance with the manufacturing method.

One method for forming a multilayer printed wiring board comprises laminating a predetermined number of copper-clad laminates while interposing a prepreg between the two adjacent copper-clad laminates and then pressing the laminated layers under a certain pressure in the thicknesswise direction for integrating the layers. (Hereinafter, this method is referred to as a laminating and pressing method.) The prepreg is formed by impregnating a glass cloth with a resin and hardening the resin to semi-hardened state, i.e., B-stage. In this laminating and pressing method, the prepreg is softened by heating to serve as an adhesive sheet for bonding the copper-clad laminates to each other. The copper-clad laminate is generally formed by laminating a plurality of prepregs on each other to provide a base substrate, bonding a copper foil to either or both surfaces of the base substrate, and then etching the copper foil to form a wiring pattern on the surface or surfaces of the base substrate. After the copper-clad laminates thus formed with wiring patterns are laminated on each other via prepregs, holes are formed, by the use of a drill, at predetermined portions of the copper-clad laminates in the thicknesswise direction. By subsequently forming vias in the holes, the copper-clad laminates are electrically connected to each other, thereby providing a multilayer printed wiring board.

The other one method for forming a multilayer printed wiring board includes the steps of preparing a relatively strong core member, laminating a buildup layer formed of an insulating material on each of opposite surfaces of the core member, forming vias in the buildup layers and forming a wiring pattern on each of the buildup layers. In this method, the lamination of a buildup layer and the subsequent process steps are repeated for providing a multilayer printed wiring board. (Hereinafter, this method is called as a buildup method.) The core member is generally formed by laminating a plurality of prepregs formed by impregnating a glass cloth with a resin. The core member is in advance formed with drill vias. Electrical connection between the wiring patterns formed on the respective buildup layers are provided through the vias formed at predetermined portions of the layers. In this buildup method, minute vias such as photo vias, laser vias and plasma vias can be formed in the buildup layers. For forming the buildup layers, an insulating material which is suitable for forming desired vias is selected.

A multilayer printed wiring board formed by the laminating and pressing method generally has a high modulus of elasticity because of the large number of rigid glass clothes contained in the copper-clad laminates and prepregs. The technique of forming a multilayer printed wiring board using members such as copper-clad laminates and prepregs reinforced by glass clothes is widely known, as disclosed in JP-A-4-309284, JP-A-5-129779, JP-A-7-314607 and JP-A-10-303556. With such a method, however, it is difficult to reduce the thickness of the multilayer printed wiring board because each of the copper-clad laminates and prepregs is relatively thick due to its inclusion of a glass cloth.

Moreover, it is also difficult to increase the density of each wiring pattern because each of the holes for the vias generally has a large diameter of about 0.3 mm or more. This is because the holes need be formed by the use of a drill due to the rigidity of the copper-clad laminates and the prepregs. If the diameter of a hole is decreased for enhancing the wiring density, the likelihood of breakage of the drill due to the glass cloth increases. Moreover, when the number of copper-clad laminates is increased, a drill of a larger diameter capable of perforating such a large number of layers need be used, which causes an increase in diameter of the holes and bars the provision of a wiring pattern having a high density.

As compared with the laminating and pressing method, the buildup method is more advantageous in that it is possible to reduce the thickness of the multilayer printed wiring board because each of the buildup layers does not contain a glass cloth. Moreover, since electrical connection between the respective wiring patterns is provided by small vias such as a photo via, a laser via or a plasma via, it is possible to increase the wiring density of the wiring patterns. In this way, the buildup method is more suitable than the laminating and pressing method for realizing thickness reduction of a multilayer printed wiring board and enhanced wiring density. Thus, a buildup-type multilayer printed wiring board formed by the buildup method is utilized for an MCM (Multi Chip Module) board, for example, which requires a wiring pattern of considerably high density.

However, as compared with a wiring board formed by the laminating and pressing method, a buildup-type multilayer printed wiring board formed by the conventional buildup method warps largely as a result of reflow soldering performed in the manufacturing process or in the process of mounting electronic components thereon. If a wiring board largely warps, undesirably non-contacting bumps may be provided, causing connection failure between electrode pads which are otherwise duly connected. For preventing such connection failure, the warping amount need be not more than 1 mm for a regular size of 510×340 mm for example. The problem of warping of the wiring board becomes more serious when the volume ratio of the buildup layers increases as a result of laminating a large number of the buildup layers.

Moreover, in recent years, the use of a lead-free solder material or a halogen-free flame retardant is demanded in view of environmental problems. For performing reflow soldering using a lead free solder material, a higher reflowing temperature than that for other materials is required. Specifically, the lowest reflowing temperature conventionally required is about 220° C., whereas a high temperature of about 240° C. at the lowest is required for a lead free solder material. However, treatment of the multilayer printed wiring board at such a high temperature causes the wiring board to warp largely. Also with this reason, it is demanded to decrease the amount of warping of the buildup-type multilayer printed wiring board due to reflow soldering.

For reducing the warping amount of the buildup-type printed wiring board, JP-A-53-126164, JP-A-5-140873, JP-A-6-97670, JP-A-7-297511 and JP-A-2000-234239 for example disclose a technique in which a relatively thick core member containing a rigid glass cloth is used and holes are made in the thick core member by the use of a drill without increasing the diameter of the holes. With such a method, however, the thickness of the multilayer printed wiring board cannot be reduced due to the thick core member.

Further, JP-A-11-233941 for example discloses a technique which alleviates warping of the buildup-type multilayer printed wiring board by making some of insulating layers from a prepreg including a glass cloth. However, the forming of insulating layers i.e., build up layers from a prepreg increases the thickness of the wiring board. Therefore, also in this case, it is not possible to respond to the demand for thickness reduction of the wiring board.

JP-A-11-158752 discloses a method which alleviates warping of the buildup-type multilayer printed wiring board by adjusting the picking number of warps and wefts of a glass cloth contained in the core member. Further, JP-A11-273456 discloses adding of an inorganic filler to the insulating material, whereas JP-A2001-7453 discloses the provision of a waste board portion at the core member. However, none of these techniques can realize high density of the wiring pattern and sufficient decrease in the warping amount of the wiring board.

SUMMARY OF THE INVENTION

It is therefore an object of the present invention to provide a buildup-type multilayer printed wiring board which resists warping due to reflow soldering in mounting electronic components on the board for example.

In accordance with a first aspect of the present invention, there is provided a multilayer printed wiring board which comprises a core member containing at least one glass cloth impregnated with a resin, and at least one buildup layer laminated on at least one surface of the core member and containing an insulating material. The glass cloth includes woven glass yarns each of which includes a bundle of glass filaments. The core member has an elastic modulus which is no less than 100 times that of the insulating material at 240° C.

The elastic modulus referred to herein means the bending elastic modulus of the core member as well as the tensile elastic modulus for the insulating material.

With such a structure, it is possible to prevent or alleviate thicknesswise warping of the multilayer printed wiring board. This is because the core member and the buildup layer of the multilayer printed wiring board differ largely from each other in elastic modulus at 240° C., which is the lowest temperature for reflow soldering, and specifically because the bending elastic modulus of the core member is no less than 100 times the tensile elastic modulus of the insulating material of the buildup layer. In such a condition, even when the core member and the buildup layer are different from each other in coefficient of thermal expansion, the core member is strong against the tension of the insulating material so that the core member is prevented from being flexed or warped.

For solving the problem of warping of a buildup-type multilayer printed wiring board caused by reflow soldering, the inventors of the present invention have noted an effective degree of difference in modulus of elasticity of a core member and a buildup layer. Conventionally, in view of the fact that a multilayer printed wiring board formed by the above-described laminating-pressing method suffers from less warping caused by reflow soldering, it has been considered to be necessary to use a buildup layer of a high elastic modulus for alleviating the warping of a buildup-type printed wiring board. By contrast, the inventors have found that a multilayer printed wiring board has a tendency of lessening the warping amount when the core member has a high elastic modulus, whereas the buildup layer has a low elastic modulus. Particularly, the inventors have found that, at the temperature of 240° C. which is the lowest temperature for performing reflow soldering using a Pb-free solder material, the warping amount of a multilayer printed wiring board is considerably lessened when the elastic modulus of the core member is no less than 100 times that of the buildup layer. The reflow soldering using a Pb-free solder material is performed at a temperature equal to or higher than 240° C. In the case where the elastic modulus of the core member is no less than 100 times that of the buildup layer at 240° C., the difference in elastic modulus is considered to increase when the temperature is higher than 240° C. According to the present invention, the temperature of 240° C. is utilized as a reference temperature for comparison of elastic modulus because the use of a Pb-free solder material is recently demanded in view of the environmental problems. However, the present invention is also applicable even where a solder material other than a Pb-free material is utilized.

The core member of a multilayer printed wiring board of the present invention may comprise a so-called copper-clad laminate which comprises a laminate of prepregs each formed by impregnating a glass cloth with a resin, and a copper foil attached to one or each surface of the prepreg.

Examples of resin for the core member include epoxy resin, polyimide resin, maleimide resin, bismaleimide resin and cyanate resin. Examples of glass constituting the glass cloth in the core member include E-glass, S-glass and Q-glass. Herein, the E-glass contains aluminum, silicon and calcium as main inorganic ingredients. The S-glass contains magnesium, aluminum and silicon as main ingredients. The Q-glass contains silicon as a main ingredient. In the present invention, the use of E-glass is most preferable in view of workability in making through-holes.

In a preferred embodiment, the core member includes a plurality of glass clothes arranged at a pitch of 50–100 $\mu$m thicknesswise of the core member. More preferably, the number of glass clothes provided is in the range of 2–20. Herein, the pitch means the shortest distance between the thicknesswise center of one glass cloth and that of an adjacent glass cloth. In another preferred embodiment, the glass cloth constitutes 45–70 volume percent of the core member. Due to such an arrangement and volume percentage of the glass cloth, the core member can maintain a high elastic modulus.

Preferably, each of the glass filaments of the glass cloth has a diameter of 3–7 $\mu$m. More preferably, the glass filament has a diameter of 3–5 $\mu$m. By using such thin filaments, it is possible to increase the contact area between the resin and the glass cloth in the core member for enhancing adhesion of the resin and the glass cloth. Moreover, when the glass filament has a diameter in the range of 5–7 $\mu$m, the formation of vias in the core member is facilitated.

Preferably, the glass cloth may comprise woven glass yarns each of which includes a bundle of 400–600 glass filaments. Preferably, the glass yarns includes warps and wefts which are woven at a count of 35–60/inch (25.4 mm). This is particularly preferable for assuring the function of the glass cloth as a reinforcing material.

The insulating material for forming the buildup layer may be a thermosetting resin such as epoxy resin, polyimide resin, cyanate resin, and maleimide resin. The insulating resin may be supplied in liquid state for in-situ solidification on the core member, or alternatively as a solid sheet which is separately prepared and attached to the core member. As described above, the present invention is effective when the elastic modulus of the core member at 240° C. is no less than 100 times that of the insulating material. However, when such a thermosetting resin is used as an insulating material for forming the buildup layer, the elastic modulus of the core member may be to not more than 2,500 times that of the insulating material.

In accordance with a second aspect of the present invention, there is provided a multilayer printed wiring board which comprises a core member, and at least one buildup layer laminated on at least one surface of the core member. The core member includes 2–6 glass clothes impregnated with a resin and arranged at a pitch of 50–100 $\mu$m thicknesswise of the core member. Each of the glass clothes comprises glass yarns including warps and wefts respectively woven at a count of 35–60/inch.

With such a structure, it is possible to eliminate or lessen warping of the multilayer printed wiring board in the thickness direction while realizing a thickness reduction of the wiring board and a high density of the wiring pattern. This is because glass clothes woven at a high density can be arranged in the core member at a lower pitch than in the prior art core member. As a result, it is possible to avoid an thickness increase of the core member, thereby enabling formation of via holes in the core member with the use of a drill having a relatively small diameter.

Preferably, each of the glass filaments has a diameter of 3–7 $\mu$m. More preferably, the glass clothes constitute 45–70 volume percent of the core member.

The multilayer printed wiring board according to the second aspect of the present invention may be formed of the same kind of resin, glass cloth and insulating material as those used for forming the multilayer printed wiring board according to the first aspect of the invention.

In either of the first and the second aspects of the present invention, 1–10 buildup layers may be laminated on one or each surface of the core member. Preferably, both surfaces of the core member are provided with an equal number of buildup layer or layers. Preferably, each of the buildup layers may have a thickness of 20–60 $\mu$m.

In either of the first and the second aspects of the present invention, the core member may further contain a metal hydroxide filler selected from the group consisting of aluminum hydroxide, magnesium hydroxide and calcium hydroxide. More preferably, the metal hydroxide filler has a particle size in a range of 0.05–15 $\mu$m. Inclusion of a metal hydroxide filler in the core member assures flame retardance of the core member while also contributing to enhancement of the elastic modulus of the core member.

Various features, objects and advantages of the present invention will become apparent from the following detailed description given with reference to the accompanying drawings.

DETAILED DESCRIPTION OF THE PREFERRED EMBODIMENTS

Preferred embodiments of the present invention will be described below in detail with reference to the accompanying drawings.

Figure 1:
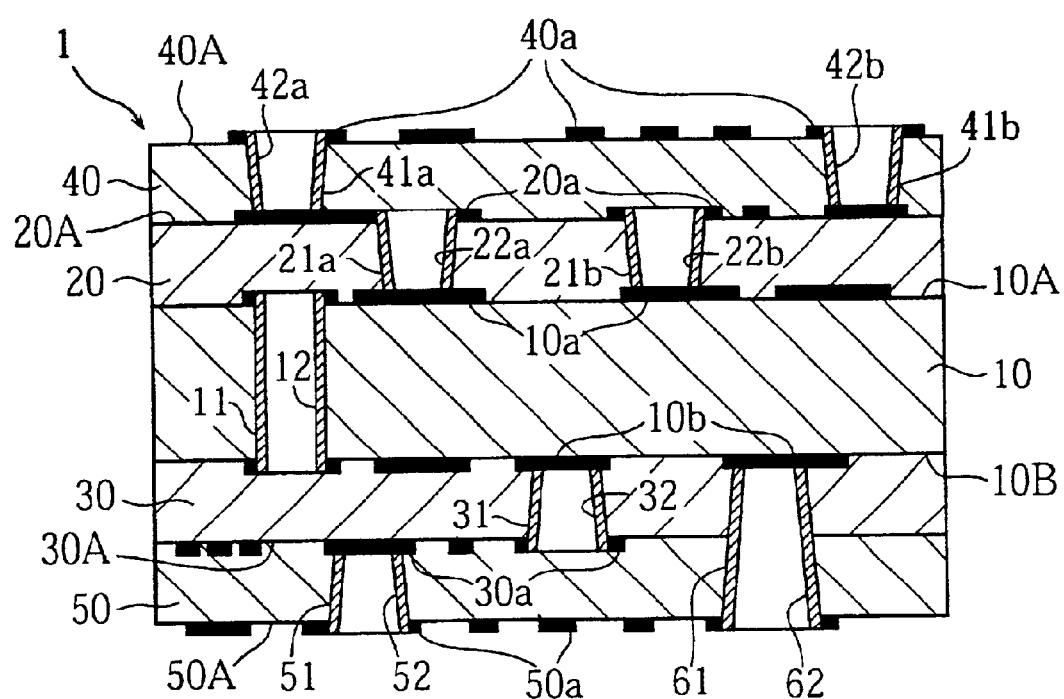
FIG. 1 is a sectional view showing a multilayer printed wiring board in accordance with the present invention.

FIG. 1 is a sectional view illustrating a multilayer printed wiring board in accordance with the present invention. The illustrated multilayer printed wiring board 1 includes a core member 10 and buildup layers 20, 30, 40 and 50. The core member 10 has a first surface 10A and a second surface 10B respectively formed with inner wiring patterns 10a and 10b. The buildup layers 20, 40 are arranged on the side of the first surface 10A of the core member 10, whereas the buildup layers 30, 50 are arranged on the side of the second surface 10B of the core member 10. The buildup layers 20, 30, 40 and 50 have respective wiring surfaces 20A, 30A, 40A and 50A on which buildup wiring patterns 20a, 30a, 40a and 50a are respectively provided.

The core member 10 is provided with via holes 11 formed with vias 12 for electrically connecting the inner wiring pattern 10a and the inner wiring pattern 10b. The buildup layer 20 is provided with via holes 21a, 21b respectively formed with vias 22a, 22b for electrically connecting the inner wiring pattern 10a and the buildup wiring pattern 20a. Similarly, the buildup layer 40 is provided with via holes 41a, 41b respectively formed with vias 42a, 42b for electrically connecting the buildup wiring pattern 20a and the buildup wiring pattern 40a.

On the other hand, the buildup layer 30 is provided with via holes 31 formed with vias 32 for electrically connecting the inner wiring pattern 10b and the buildup wiring pattern 30a. Similarly, the buildup layer 50 is provided with via holes 51 formed with vias 52 for electrically connecting the buildup wiring pattern 30a and the buildup wiring pattern 50a. Further, the inner wiring pattern 10b and the buildup wiring pattern 50a are electrically connected through vias 62 formed in via holes 61 which penetrate through both of the buildup layers 30 and 50. With such a structure, electronic components are appropriately mounted on the outermost buildup layers 40, 50.

The multilayer printed wiring board 1 having the above-described structure may be made by the process shown in FIGS. 2a through 5d.

Figure 2A:
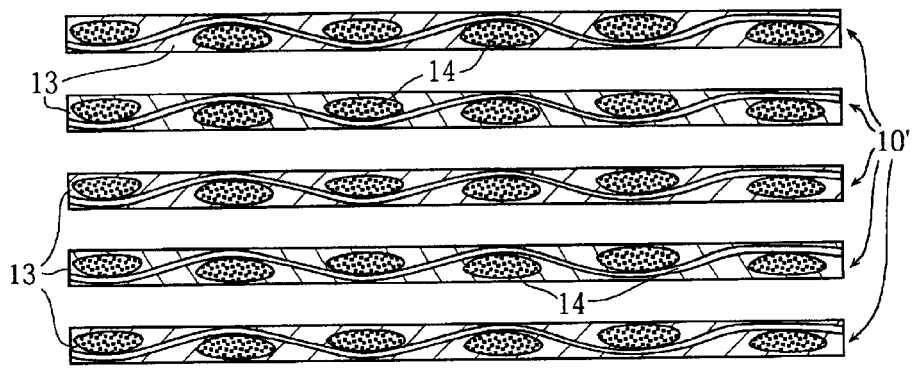
FIGS. 2a through 2d are sectional views illustrating process steps for making the multilayer printed wiring board shown in FIG. 1.

First, a core member 10 is prepared by the process steps shown in FIGS. 2a~2d. Specifically, as shown in FIG. 2a, five sheets of prepregs 10' each of which has a thickness of 50~100 $\mu$m are prepared by impregnating a glass cloth 14 with a resin 13 followed by curing the resin to the B-stage state (incompletely hardened state). In this embodiment, the glass cloth 14 is prepared by plain-weaving glass yarns at a density (or count) of 35~60 yarns per 25.4 mm for warps and wefts, respectively. Each of the yarns comprises a bundle of 400~600 glass filaments each having a diameter of 3~9 $\mu$m.

Figure 2B:
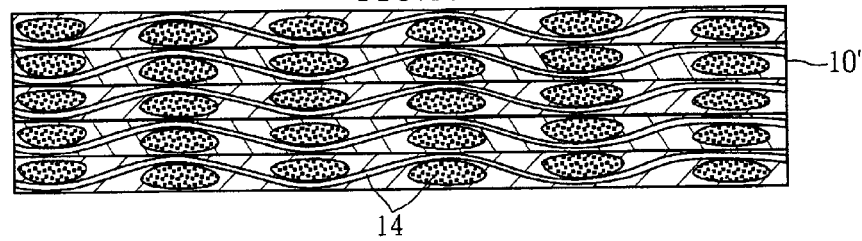
Figure 2C:
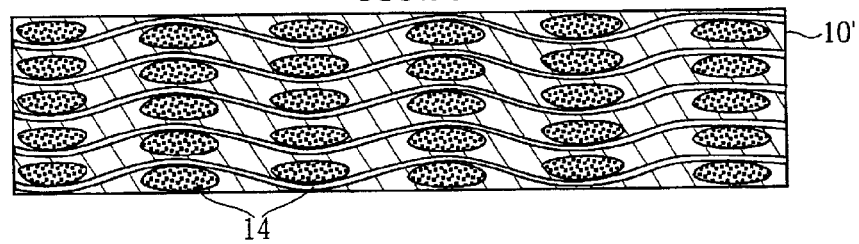

Then, as shown in FIG. 2b, the prepregs 10' are laminated and pressed together at a temperature of 120~220° C. for a period of 20~60 minutes for integrating the prepregs 10' (FIG. 2c).

Figure 2D:
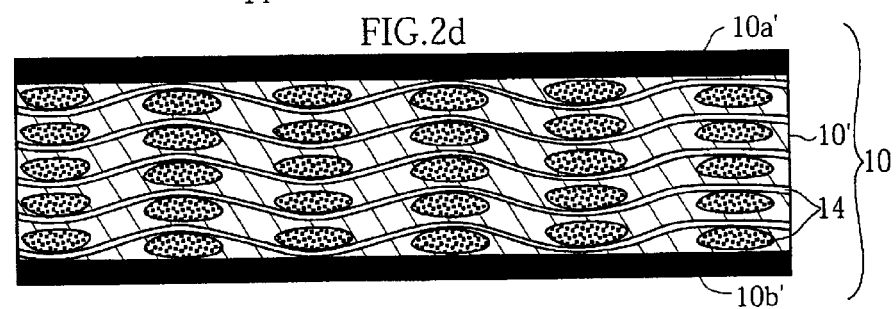

Subsequently, as shown in FIG. 2d, copper foils 10a', 10b' each having a thickness of 9~18 μm are bonded onto the opposite surfaces of the integrated laminate of prepregs 10', thereby providing a core member 10. It is to be noted that the specific structure of the core member 10 is not limitative on the present invention. The number and/or arrangement of the prepregs 10' may be variable if only a desired modulus of elasticity can be obtained. Note that the glass clothes 14 in the core member 10 are omitted in the figures other than FIG. 2 for the convenience of illustration.

Figure 3A:
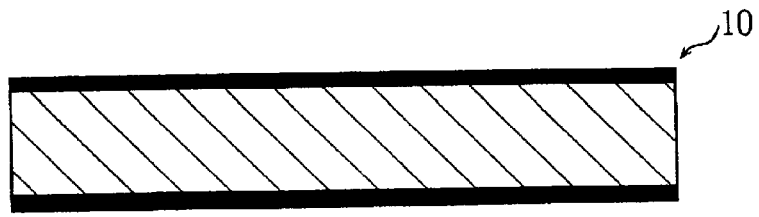
FIGS. 3a through 3d are sectional views illustrating process steps, subsequent to the process steps shown in FIGS. 2a–2d for making the multilayer printed wiring board shown in FIG. 1.
Figure 3B:
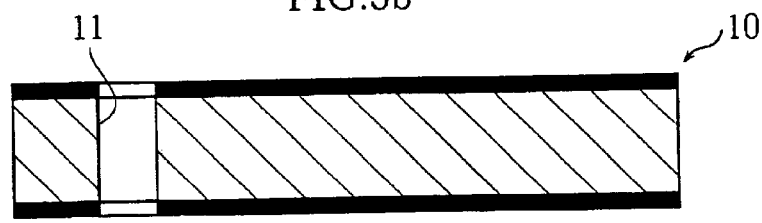

After the preparation of the core member 10, inner wiring patterns are formed on the core member 10 by the process steps shown in FIGS. 3a–3d. Specifically, the core member 10 which is still unworked (FIG. 3a) is first formed with via through-holes 11 (only one shown) by drilling for example, as shown in FIG. 3b.

Figure 3C:
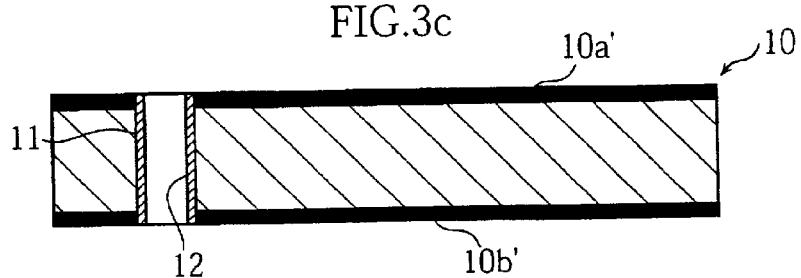
Figure 3D:
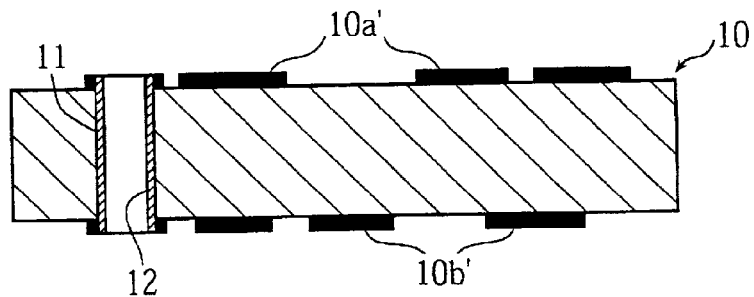

Then, as shown in FIG. 3c, a through-conductor 12 is formed on the inner surface of each through-hole 11 by electroless plating for example.

Subsequently, each of the copper foils 10a', 10b' is etched to form an inner wiring pattern 10a, 10b, as shown in FIG. 10d.

After such processing of the core member 10, buildup layers 20, 30 are laminated on the core member 10 by performing the process steps shown in FIGS. 4a–4d.

Figure 4A:
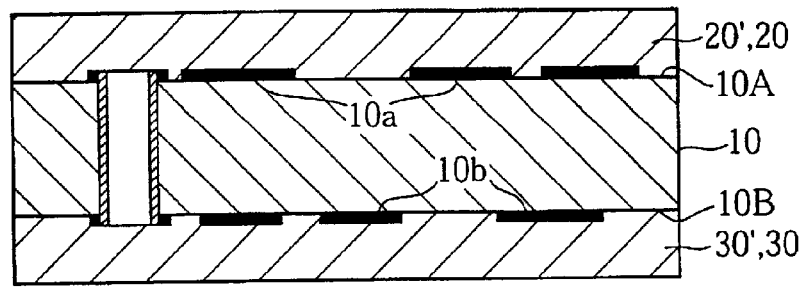
FIGS. 4a through 4d are sectional views illustrating process steps, subsequent to the process steps shown in FIGS. 3a–3d, for making the multilayer printed wiring board shown in FIG. 1.

Specifically, as shown in FIG. 4a, insulating films 20', 30' for forming buildup layers are disposed on the core member 10 to cover the inner wiring patterns 10a, 10b respectively on a first surface 10A and a second surface 10B of the core member 10. The insulating films 20', 30' may be bonded onto the first and the second surfaces 10A, 10B, respectively, by thermo-compression at a temperature of 100~200° C. Alternatively, the insulating films 20', 30' may be softened by heating for adhesion to the first and the second surfaces 10A, 10B under their own weight. Further alternatively, the buildup layers 20, 30 may be formed by applying an insulating material in liquid state onto the first and the second surfaces 10A, 10B by roll coat or by screen printing followed by hardening the insulating material by heating. The respective outer surfaces of the buildup layers 20, 30 thus laminated on the core member 10 are flattened by abrading before subsequent formation of wiring patterns.

Figure 4B:
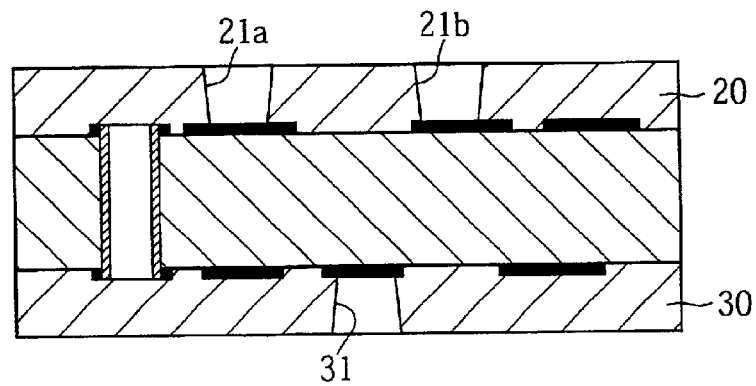

Then, as shown in FIG. 4b, via holes 21a, 21b, 31 are formed at predetermined portions of the buildup layer 20, 30 by utilizing laser beam or plasma etching. Alternatively, the via holes 21a, 21b, 31 may be formed by utilizing photolithography in the case where the buildup layers 20, 30 are formed of a photosensitive resin.

Figure 4C:
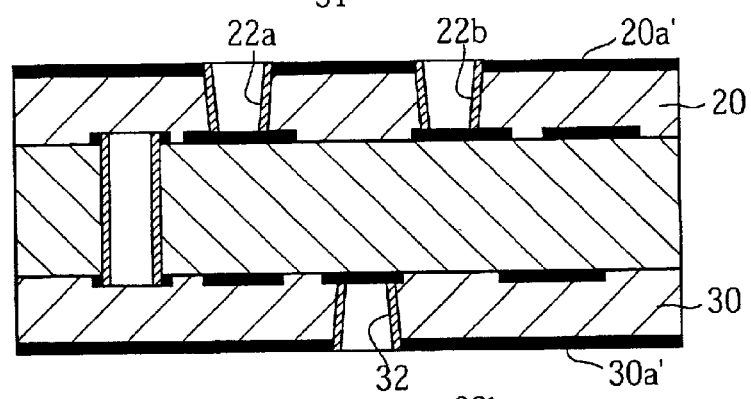

Subsequently, as shown in FIG. 4c, conductor layers 20a', 30a' are formed on the respective wiring surfaces 20A, 20B by plating or vapor deposition. At this time, the conductor layers 20a', 30a' extend partially into the via holes 21a, 21b, 31 to provide vias 22a, 22b, 32, respectively.

Figure 4D:
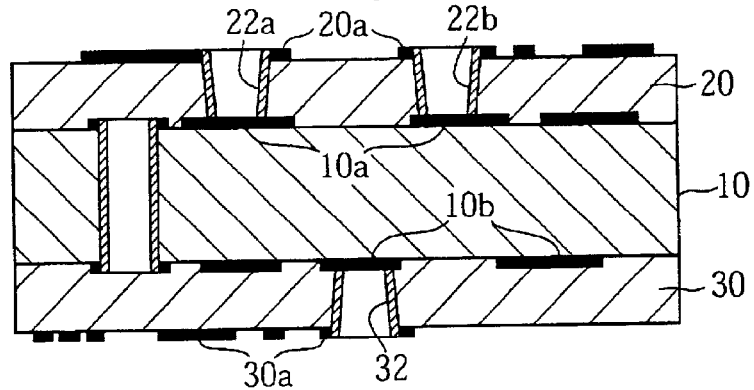

Then, as shown in FIG. 4d, the conductor layers 20a', 30a' are etched to form buildup wiring patterns 20a, 30a, respectively. The buildup wiring patterns 20a, 30a may be formed by panel plating method, semi-additive method or full-additive method. Thus, the inner wiring pattern 10a is electrically connected to the buildup wiring pattern 20a through the vias 22a, 22b, whereas the inner wiring pattern 10b is electrically connected to the buildup wiring pattern 30a through the vias 32 (only one shown).

After the formation of the buildup layers 20, 30, buildup layers 40, 50 are laminated on the buildup layers 20, 30, respectively, by performing the process steps shown in FIGS. 5a–5d.

Figure 5A:
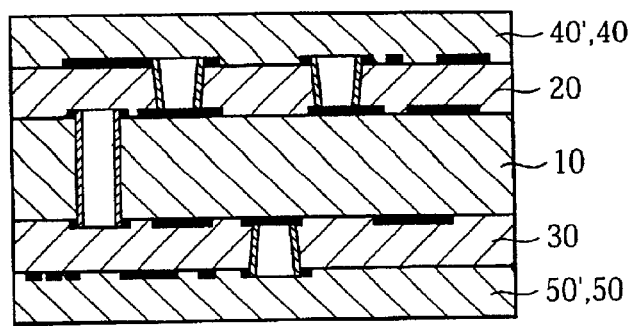
FIGS. 5a through 5d are sectional views illustrating process steps, subsequent to the process steps shown in FIGS. 4a–4d, for making the multilayer printed wiring board shown in FIG. 1.

Specifically, as shown in FIG. 5a, insulating films 40', 50' for buildup layers 40, 50 are first laminated on the buildup layers 20, 30, respectively. The lamination of the insulating films 40', 50' may be performed similarly to the lamination of the insulating films 20', 30' for the underlying buildup layers 20, 30.

Figure 5B:
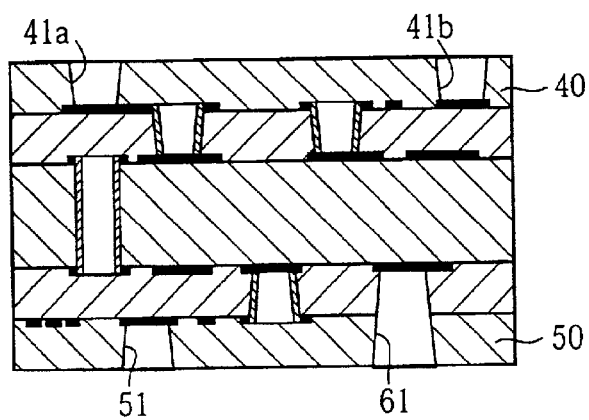

Then, as shown in FIG. 5b, via holes 41a, 41b, 51, 61 are formed at predetermined portions of the buildup layer 40, 50. At this time, one or more of the via holes (via hole 61 in the embodiment) may be so formed as to penetrate through the two buildup layers 30, 50. When the insulating films 30', 40', 50' are made of a photosensitive resin, the via holes 41a, 41b, 51, 61 may be formed by utilizing photolithography.

Figure 5C:
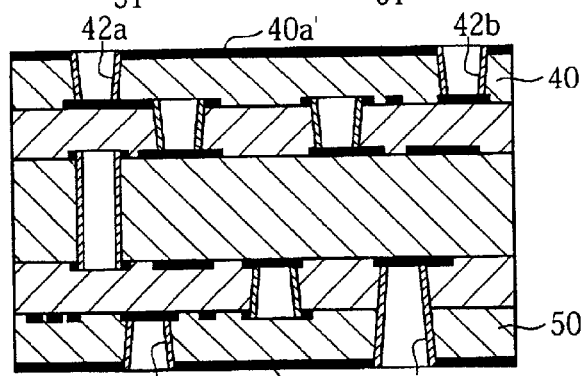

Thereafter, as shown in FIG. 5c, conductor layers 40a', 50a' are formed on the respective outer surfaces of the buildup layers 40, 50 by plating or vapor deposition. At this time, the conductor layers 40a', 50a' extend partially into the respective via holes 41a, 41b, 51, 61 to provide vias 42a, 42b, 52 and 62 are formed.

Figure 5D:
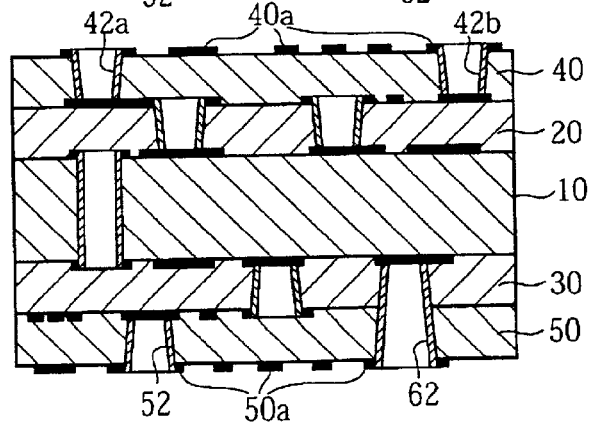

Finally, as shown in FIG. 5d, buildup wiring patterns 40a, 50a are formed similarly to the buildup wiring patterns 20a, 30a. In this way, the buildup wiring pattern 20a and the buildup wiring pattern 40a are electrically connected through the vias 42a, 42b, whereas the buildup wiring pattern 30a and the buildup wiring pattern 50a are electrically connected through the vias 52. Further, the inner wiring pattern 10b and the buildup wiring pattern 50a are electrically connected through the vias 62.

The present invention will now be described through embodiments and comparative examples. However, it is to be noted that the present invention is not limited to these examples.

Embodiment 1

[Measurement of Elastic Modulus]

In Embodiment 1, use was made of a core member (Tradename: H-32, Supplier: Showa Denko K. K) which had a thickness of 0.4 mm and a workpiece size of 340×510 mm. The core member contained 50 volume % of glass cloth. The core member was a laminate of prepregs each prepared by impregnating a glass cloth (E-glass) with an epoxy resin, and attaching copper foils to the opposite surfaces of the prepreg laminate. The glass cloth comprised filaments each having a diameter of 5 μm. The epoxy resin contained, as dispersed therein, powder of aluminum hydroxide having an average particle size of 3.8 μm. Each of the copper foils had a thickness of 18 μm.

Further, epoxy resin sheets (Tradename: ABF-SH, Supplier: Ajinomoto Co., Inc.) were used as insulating films for forming buildup layers. Each of the resin sheets had a thickness of 50 μm.

The bending elastic modulus of the core member was measured by the three-point bending method using an elastic modulus measuring device (Tradename: UCT-30T, Supplier: Orientech). In the measurement, the crosshead of the elastic modulus measuring device was moved at a speed of 1.0 mm/min in pressing contact with a sample sheet which had a thickness of 0.8 mm and supported at two support points spaced from each other by 22 mm. The measurement was performed with respect to three samples. As a result, the core member was found to have a bending elastic modulus of 16 GPa at 240° C.

Further, the tensile elastic modulus of the resin sheet was measured by the crosshead-travel measuring method using another modulus measuring device (Tradename: TENSILON VCT-5T, Supplier: Orientech). In the measurement, the sample sheet having a thickness of 50 μm was stretched by a travelling crosshead at a speed of 5 mm/min between the clamps which were spaced from each other by 45 mm. The measurement was performed with respect to three samples. As a result, the resin sheet was found to have a tensile elastic modulus of 55 MPa at 240° C.

The results of elastic modulus measurement in this embodiment are listed in Table 1 together with those for the following embodiments and comparative examples. It is to be noted that the measurement in the following embodiments and comparative examples was performed under the same conditions as in this embodiment.

[Buildup]

Through-holes were formed at predetermined portions of the core member using a drill having a diameter of 0.25 mm, and the copper foils were etched to provide inner wiring patterns on the opposite surfaces of the core member. Then, the above-described resin sheets were disposed on the inner wiring patterns and bonded thereto by compressing the resin sheets perpendicularly to the inner wiring patterns with the temperature held at 130° C. The resin sheets were then heat-treated for 60 minutes at a temperature of 180° C. for accelerating hardening.

[Measurement of Warping]

The amount of warping of the multilayer printed wiring board thus provided and including three buildup layers on each surface of the core member was measured using a contact-type three-dimensional measurement device (Tradename: RV304, Supplier: Mitutoyo Corporation). In the measurement, the multilayer printed wiring board was disposed on a flat support plate with its concave surface facing upward for measuring the maximum gap between the support plate and the printed wiring board in a measuring area of 300×450 mm. As a result of the measurement, the maximum gap, which was indicative of the warping amount, was 0.485 mm. Further, the warping amount increased to 0.615 mm after the wiring board was heated ten times (one minute for each time) in a reflow furnace held at a temperature range of 240~250° C. The results of the warping measurement in this embodiment is also listed in Table 1 together with those for the following embodiments and comparative examples. It is to be noted that the warping measurement was performed in the following Embodiments and comparative examples under the same conditions as in this Embodiment.

COMPARATIVE EXAMPLE 1

[Measurement of Elastic Modulus]

In Comparative Example 1, use was made of a core member (Tradename: CS-3355(FR-4), Supplier: Risho Kogyo Co., Ltd.) which had a thickness of 0.4 mm and a workpiece size of 340×510 mm. The core member contained 40 volume % of glass cloth. The core member was a laminate of prepregs each prepared by impregnating a glass cloth with an epoxy resin, and attaching copper foils to the opposite surfaces of the prepreg laminate. The glass cloth comprised filaments each having a diameter of 5 $\mu$m. The epoxy resin did not contain powder of aluminum hydroxide, as opposed to Embodiment 1. Each of the copper foils had a thickness of 18 $\mu$m. As a result of elastic modulus measurement, this core member was found to have a bending elastic modulus of 4 GPa at 240° C.

[Measurement of Warping Amount]

The above-described core member and the resin sheets prepared in Embodiment 1 were laminated to form a multilayer printed wiring board including three buildup layers on each surface of the core member. As a result of the same warping measurement as performed in Embodiment 1, the wiring board had an initial warping of 2.730 mm. After the printed wiring board was heated ten times in a reflow furnace, the amount of warping increased to 4.755 mm.

Embodiment 2

[Measurement of Elastic Modulus]

In Embodiment 2, use was made of a core member which had a thickness of 0.4 mm and a workpiece size of 340×510 mm. The core member contained 45 volume % of glass cloth. The core member was a laminate of prepregs each prepared by impregnating a glass cloth with an epoxy resin, and attaching copper foils to the opposite surfaces of the prepreg laminate. The glass cloth comprised filaments each having a diameter of 7 $\mu$m. The epoxy resin contained, as dispersed therein, powder of magnesium hydroxide having an average particle size of 3 $\mu$m and powder of silica having an average particle size of 4 $\mu$m. Each of the copper foils had a thickness of 18 $\mu$m.

Further, polyimide resin sheets were used as insulating films for forming buildup layers. Each of the resin sheets had a thickness of 30 $\mu$m.

As a result of the elastic modulus measurement performed in the same way as in Embodiment 1, the core member was found to have a bending elastic modulus of 14 GPa at 240° C., whereas the polyimide resin sheet was found to have a tensile elastic modulus of 80 MPa at 240° C.

[Buildup]

Through-holes were formed at predetermined portions of the core member using a drill having a diameter of 0.25 mm, and the copper foils were etched to provide inner wiring patterns on the opposite surfaces of the core member. Then, the above-described resin sheets were disposed on the inner wiring patterns and bonded thereto by compressing the resin sheets perpendicularly to the inner wiring patterns with the temperature held at 170° C. The resin sheets were then heat-treated for 60 minutes at a temperature of 210° C. for accelerating hardening.

[Measurement of Warping]

The amount of warping of the multilayer printed wiring board thus provided and including three buildup layers on each surface of the core member was measured in the same way as in Embodiment 1. As a result of the measurement, the initial warping amount (maximum gap) of the multilayer printed wiring board was 0.335 mm. Further, the warping amount increased to 0.550 mm after the wiring board was heated ten times (one minute for each time) in a reflow furnace held at a temperature range of 240~250° C.

Embodiment 3

[Measurement of Elastic Modulus]

In Embodiment 3, use was made of a core member (Tradename: CS-3665S, Supplier: Risho Kogyo Co., Ltd.) which had a thickness of 0.5 mm and a workpiece size of 340×510 mm. The core member was a laminate of five prepregs each prepared by impregnating a glass cloth (E-glass) with an epoxy resin, and attaching copper foils to the opposite surfaces of the prepreg laminate. Each of the prepregs had a thickness of 0.1 mm. The glass cloth was prepared by weaving glass yarns (Warps: MIL Standards ECD450-½, Wefts: MIL Standards ECD450-½) at a count of 40×39 yarns/inch. Each of the yarns included an average of 400 filaments each having a diameter of 5 $\mu$m. The epoxy resin did not contain any aluminum hydroxide nor silicate. Each of the copper foils had a thickness of 18 $\mu$m. The core member had a bending elastic modulus of 14 GPa at 240° C.

Further, epoxy resin sheets (Tradename: ABF-H, Supplier: Ajinomoto Co., Inc.) were used as insulating films for forming buildup layers. Each of the resin sheets had a thickness of 50 $\mu$m. The resin sheet had a tensile elastic modulus of 80 MPa at 240° C.

[Buildup]

Through-holes were formed at predetermined portions of the core member using a drill having a diameter of 0.3 mm, and the copper foils were etched to provide inner wiring patterns on the opposite surfaces of the core member. Then, the above-described resin sheets were disposed on the inner wiring patterns and bonded thereto by compressing the resin sheets perpendicularly to the inner wiring patterns with the temperature held at 130° C. The resin sheets were then heat-treated for 90 minutes at a temperature of 170° C. for accelerating hardening.

[Measurement of Warping]

The amount of warping of the multilayer printed wiring board thus provided and including three buildup layers on each surface of the core member was measured in the same way as in Embodiment 1. As a result of the measurement, the initial warping amount (maximum gap) of the multilayer printed wiring board was 0.42 mm. Further, the warping amount increased to 0.56 mm after the wiring board was heated ten times (one minute for each time) in a reflow furnace held at a temperature range of 240~250° C.

Embodiments 4–12

A plurality of multilayer printed wiring boards which included 2–10 buildup layers on each surface of the respective core member were prepared in the same manner as in Embodiment 3. The respective warping amounts (maximum gaps) of these wiring boards were measured before and after the wiring boards were subjected to the reflow process ten times. The measurement results of the wiring boards including 2~10 buildup layers are given in Table 1 as Embodiments 4~12, respectively.

COMPARATIVE EXAMPLE 2

An FR-4 core board having a thickness of 0.5 mm and a workpiece size of 340×510 mm was prepared which comprised five sheets of glass cloth laminated one above another at a pitch of 0.1 mm with copper foils of 18 μm thickness attached to the opposite surfaces of the core member. The glass cloth was prepared by weaving glass yarns each comprising an average of 200 glass filaments (E-glass) having a diameter of 7 μm. The core board had a bending elastic modulus of 3.2 GPa at 240° C.

Like Embodiment 3, epoxy resin sheets (Tradename: ABF-H, Supplier: Ajinomoto Co., Inc.) were used as insulating films for forming buildup layers.

The amount of warping of the multilayer printed wiring board thus provided and including one buildup layer on each surface of the core member was measured in the same way as in Embodiment 3. As a result of the measurement, the initial warping amount (maximum gap) of the multilayer printed wiring board was 0.65 mm. Further, the warping amount increased to 1.48 mm after the wiring board was heated ten times (one minute for each time) in a reflow furnace held at a temperature range of 240~250° C.

COMPARATIVE EXAMPLES 3 AND 4

A plurality of multilayer printed wiring boards which included 2–3 buildup layers on each surface of the respective core member were prepared in the same manner as in Comparative Example 2. The respective warping amounts of these wiring boards were measured before and after the wiring boards were subjected to the reflow process ten times in the same manner as in Comparative Example 2. The measurement results of the wiring boards including 2–3 buildup layers are given in Table 1 as Comparative Examples 3 and 4, respectively.

Embodiment 13

Two core members were prepared in the same manner as in Embodiment 3. The core members were laminated on each other and perforated with a drill having a diameter of 0.25 mm. The drill was driven at 100,000 rpm and fed at 25 μm/revolution. As a result, the positional deviation at the drill-entering side was an average of 6.6 μm, whereas the positional deviation at the drill-exiting side was an average of 9.6 μm. In this way, sufficient positional accuracy was obtained. Further, the drill was not broken even when 2,000 holes were formed.

TABLE 1

| | Number of Buildup Layers on Each Surface | Modulus of Core Member (GPa) | Modulus of Resin Sheet (MPa) | Warping Amount before Reflow (mm) | Warping Amount after Reflow (mm) |
|---|---|---|---|---|---|
| Embodiment 1 | 3 | 16 | 55 | 0.485 | 0.615 |
| Comparative Example 1 | 3 | 4 | 55 | 2.730 | 4.755 |
| Embodiment 2 | 3 | 14 | 80 | 0.335 | 0.550 |
| Embodiment 3 | 1 | 17 | 35 | 0.42 | 0.56 |
| Comparative Example 2 | 1 | 3.2 | 35 | 0.65 | 1.48 |
| Embodiment 4 | 2 | 17 | 35 | 0.50 | 0.60 |
| Comparative Example 3 | 2 | 3.2 | 35 | 1.22 | 3.05 |
| Embodiment 5 | 3 | 17 | 35 | 0.55 | 0.66 |
| Comparative Example 4 | 3 | 3.2 | 35 | 2.49 | 5.21 |
| Embodiment 6 | 4 | 17 | 35 | 0.62 | 0.70 |
| Embodiment 7 | 5 | 17 | 35 | 0.66 | 0.73 |
| Embodiment 8 | 6 | 17 | 35 | 0.71 | 0.91 |
| Embodiment 9 | 7 | 17 | 35 | 0.77 | 0.94 |
| Embodiment 10 | 8 | 17 | 35 | 0.82 | 0.98 |
| Embodiment 11 | 9 | 17 | 35 | — | 1.05 |
| Embodiment 12 | 10 | 17 | 35 | — | 1.12 |

As shown in Table 1, by setting the elastic modulus of the core member to less than 100 times that of each insulating film, the amount of warping of the multilayer printed wiring board caused in the manufacturing or reflow process can be decreased by using a large number of buildup layers are laminated. Further, by using a core member comprising glass clothes laminated at a small pitch, it is possible to realize thickness reduction of the multilayer printed wiring board while facilitating formation of minute through-holes in the core member, which leads to the provision of a multilayer printed wiring board of a high wiring density.

The present invention being thus described, it is obvious that the same may be varied in many ways. Such variations are not regarded as a departure from the spirit and scope of the present invention, and all such variations as would be obvious to those skilled in the art are intended to be included in the scope of the following claims.

What is claimed is:

1. A multilayer printed wiring board comprising:
   a core member containing at least one glass cloth impregnated with a resin, said at least one glass cloth including woven glass yarns, each of the glass yarns including a bundle of glass filaments; and at least one buildup layer laminated on at least one surface of the core member, the buildup layer containing an insulating material;

wherein the core member has an elastic modulus which is no less than 100 times that of the insulating material at 240° C.; and wherein the core member further contains a metal hydroxide filler selected from the group consisting of aluminum hydroxide, magnesium hydroxide and calcium hydroxide.

2. The multilayer printed wiring board according to claim 1, wherein the elastic modulus of the core member is 14–25 GPa at 240° C., whereas the elastic modulus of the insulating material is 10–140 MPa at 240° C.

3. The multilayer printed wiring board according to claim 1, wherein the core member includes a plurality of glass clothes.

4. The multilayer printed wiring board according to claim 1, wherein each of the glass yarns is a bundle of 400–600 glass filaments.

5. The multilayer printed wiring board according to claim 1, wherein the glass yarns of said at least one glass cloth include warps and wefts respectively woven at a count of 35–60/inch.

6. A multilayer printed wiring board comprising:

a core member; and at least one buildup layer laminated on at least one surface of the core member;

wherein the core member including 2–6 glass clothes impregnated with a resin, wherein each of the glass clothes comprises glass yarns including warps and wefts respectively woven at a count of 35–60/inch, and wherein the core member further contains a metal hydroxide filler selected from the group consisting of aluminum hydroxide, magnesium hydroxide and calcium hydroxide.

7. The multilayer printed wiring board according to claim 6, wherein each of the glass yarns includes a bundle of glass filaments each having a diameter of 3–9 $\mu$m.

8. The multilayer printed wiring board according to claim 6, wherein the glass clothes constitute 45–70 volume percent of the core member.

9. The multilayer printed wiring board according to claim 6, wherein 1–10 buildup layers are laminated on said at least one surface of the core member.

10. The multilayer printed wiring board according to claim 6, wherein both surfaces of the core member are provided with an equal number of buildup layer or layers.

11. The multilayer printed wiring board according to claim 6, wherein said at least one buildup layer has a thickness of 20–60 $\mu$m.

12. The multilayer printed wiring board according to claim 6, wherein the glass filaments are made of E-glass.

13. The multilayer printed wiring board according to claim 6, wherein the metal hydroxide filler has a particle size of 0.05–15 $\mu$m.

14. The multilayer printed wiring board according to claim 6, wherein the buildup layer is made of a thermosetting resin.

15. The multilayer printed wiring board according to claim 14, wherein the thermosetting resin comprises epoxy.

* * * * *